Figure 1:
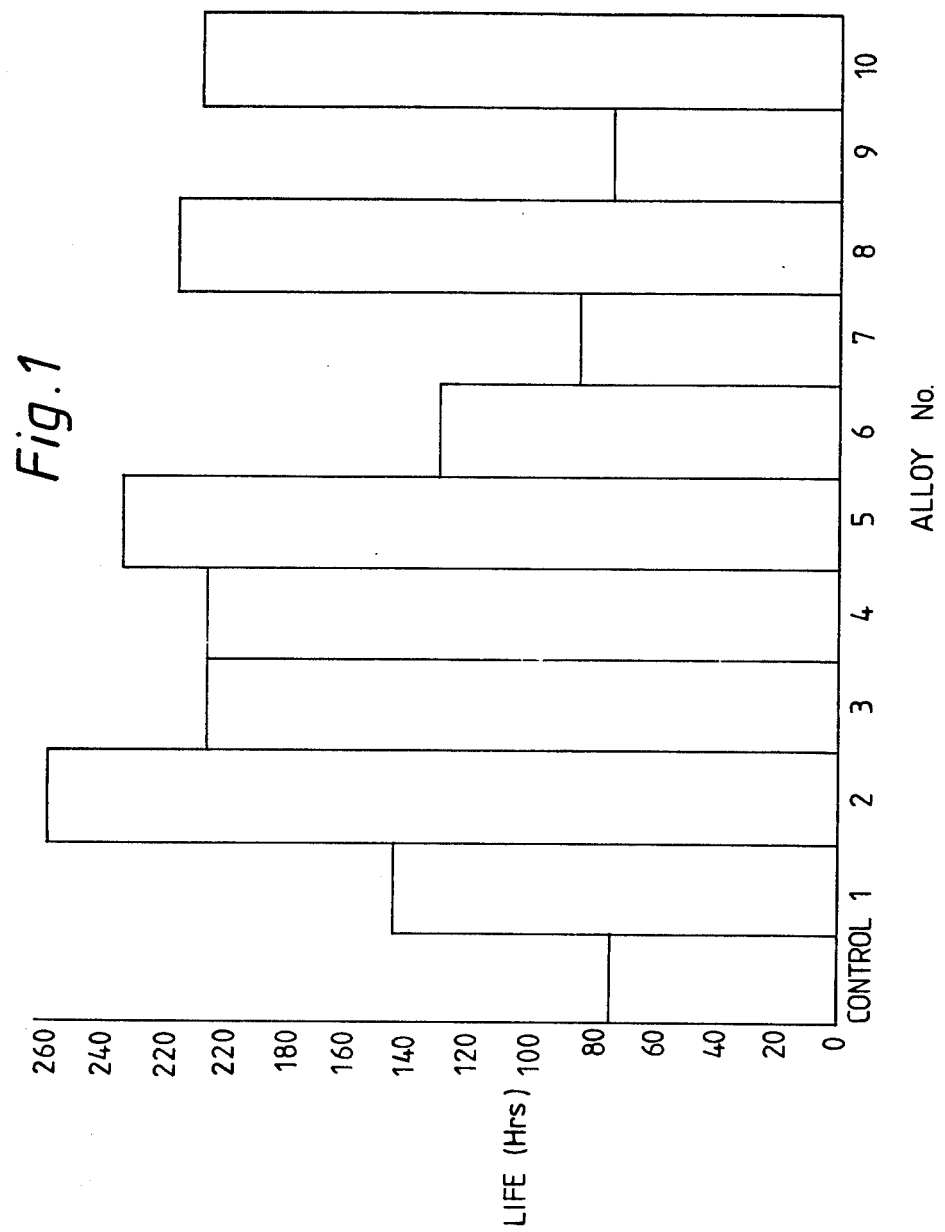

United States Patent [19]

Meetham et al.

[11] Patent Number: 4,459,160
[45] Date of Patent: Jul. 10, 1984

[54] SINGLE CRYSTAL CASTINGS

[75] Inventors: Geoffrey W. Meetham, Allestree; Michael J. Goulette, Mickleover, both of England

[73] Assignee: Rolls-Royce Limited, London, England

[21] Appl. No.: 303,581

[22] Filed: Sep. 18, 1981

Related U.S. Application Data

[63] Continuation-in-part of Ser. No. 242,826, Mar. 12, 1981, abandoned.

[30] Foreign Application Priority Data

Mar. 13, 1980 [GB] United Kingdom ................. 8008578
Mar. 4, 1981 [GB] United Kingdom ................. 8106810
Mar. 11, 1981 [DE] Fed. Rep. of Germany ....... 3109292

[51] Int. Cl.³ ............................................. C22F 1/10
[52] U.S. Cl. ...................................... 148/3; 148/162; 148/404; 148/410
[58] Field of Search .................... 75/171, 170; 148/32, 148/32.5, 3, 162

[56] References Cited

U.S. PATENT DOCUMENTS 4,116,723  9/1978  Gell et al. ............................. 75/171
4,209,348  6/1980  Duhl et al. ............................ 75/171

Primary Examiner—R. Dean
Attorney, Agent, or Firm—Cushman, Darby & Cushman

[57] ABSTRACT

An alloy composition intended for use in the form of a single crystal casting comprises a modified nickel-based superalloy. The alloy consists essentially of, by weight percent, 7-13% Chromium,
0-15% Cobalt,
1.25-3% Titanium+½ Niobium,
4.5-6.7% Aluminium,
3-12% Tungsten,
0-3.5% Molybdenum,
0-5% Tantalum,
0-2% Hafnium,
0-1.5% Vanadium,
0.015-0.05% Carbon,
0-0.01% Boron,
0-0.05% Zirconium, Balance essentially Nickel plus incidental impurities.

The invention also contemplates a heat treatment for the alloy comprising initially heating to 1300°-1320° C. followed by cooling to room temperature and ageing the alloy at a temperature of about 870° C. for 16 hours.

8 Claims, 2 Drawing Figures

SINGLE CRYSTAL CASTINGS

This application is a continuation-in-part of our co-pending U.S. patent application Ser. No. 242,826, filed Mar. 12, 1981, now abandoned.

This invention relates to an alloy suitable for making single-crystal castings and to a casting made thereof.

Where objects of nickel-based alloys are intended for use at high temperatures under difficult conditions of stress and corrosion attack, it has been appreciated that castings made as a single crystal offer potential advantages in their combination of life and resistance to elevated temperatures. The main area in which these properties are of use lies in the hotter parts, such as nozzle guide vanes and turbine rotor blades, of gas turbine engines. However, the commonly-used nickel-based superalloys, although highly developed as materials for equi-axed conventional castings, include ranges of constituents which may not be beneficial to the properties of a single-crystal casting of the material.

Taking a modern nickel-based superalloy as a basis, we have invented a range of alloy compositions giving very good properties when used in the form of a single crystal casting.

According to the present invention an alloy suitable for use in the form of a single-crystal casting comprises, by weight percent,
7–13% Chromium,
0–15% Cobalt,
1.25–3% Titanium + ½ Niobium,
4.5–6.7% Aluminium,
3–12% Tungsten
0–3.5% Molybdenum,
0–5% Tantalum,
0–2% Hafnium,
0–1.5% Vanadium,
0.015–0.05% Carbon,
0–0.01% Boron,
0–0.05% Zirconium,
Balance Nickel plus incidental impurities.
Preferably the alloy comprises, by weight percent,
8–10% Chromium,
2–11% Cobalt,
1.7–2.6 Titanium + ½ Niobium,
5.25–5.75% Aluminium,
9–11% Tungsten,
0–1% Molybdenum,
2.25–5% Tantalum,
0–1.7% Hafnium,
0.015–0.05% Carbon,
0–0.01% Boron,
0.0.01% Zirconium,
Balance Nickel plus incidental impurities We find that a range of 3–7% Cobalt is particularly advantageous.

Where appropriate the alloy may be solution heat treated to a temperature of about 1300° C.; thus in specific cases the heat treatment was in the range 1300°–1320° C. for 1–10 hours followed by cooling to room temperature and heating to 870° C. for 16 hours.

The invention also includes a cast object in single crystal form made of the alloy, and particularly a cast gas turbine rotor blade in single crystal form made of the alloy.

Figure 2:
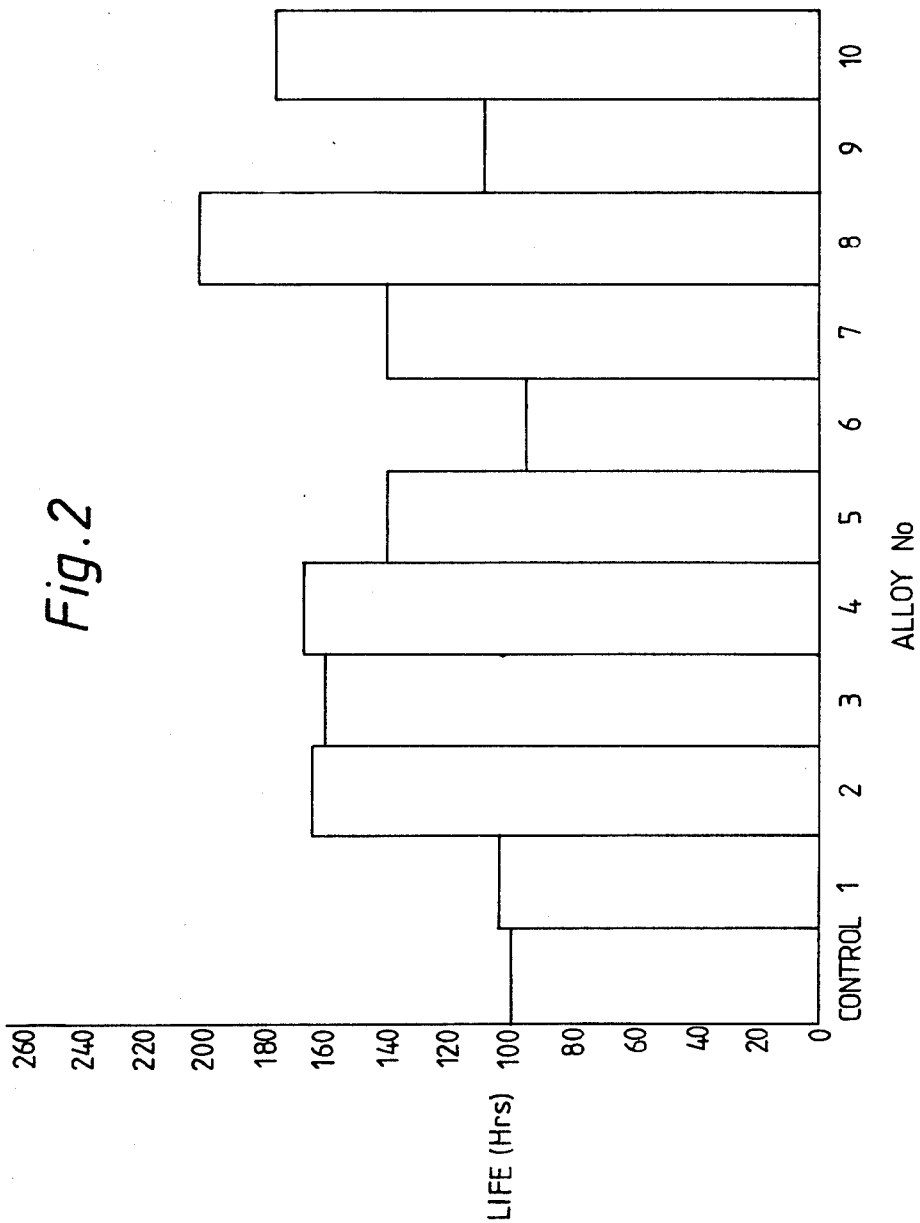

Tests were carried out to confirm the properties of alloys in accordance with the invention, and these are described below with reference to the accompanying drawings in which:

FIG. 1 is a bar-chart of the life of various alloy test pieces under stress at a first, lower temperature, and FIG. 2 is a chart similar to FIG. 1 but of results obtained at a second, higher temperature.

In order to test alloys in accordance with the invention, test pieces of the various alloys were made in cast single crystal form. There are two basic methods by which single-crystal castings may be made; these are now well-known in the art, and generally comprise either the use of a seed crystal or the use of directional solidification followed by the use of a labyrinthine passage which serves to select a single crystal of the alloy which grows to form the test piece.

Although either method could have been used, we found it convenient to use the latter technique and for each of the various test alloys a test piece in the form of a single crystal was made. In order to provide a control, a similar test piece was cast in the form of a directionally solidified material. As will be appreciated, the directionally solidified material consists of a plurality of individual grains all of which are parallel, and this type of material usually has better properties than would a conventional or equi-axed casting of the same alloy.

In the accompanying drawings the results are compared for ten single-crystal test pieces and one directionally solidified control which were made and were tested for their stress-rupture lives at a lower temperature (760° C.) and at a higher temperature (1040° C.).

The nominal compositions each were as follows, although it should be noted that the actual analysis differed slightly from these 'target' figures. In fact, one deviation of considerable significance occurs in the amount of Titanium in alloys 8 and 9; it is found by analysis that the actual Titanium contents of these alloys are 1.74 and 1.7 respectively. The significance of these changes is discussed below.

|         | Chromium | Cobalt | Titanium | Aluminium | Tungsten | Tantalum | Hafnium | Carbon | Boron | Zirconium |
|---------|----------|--------|----------|-----------|----------|----------|---------|--------|-------|-----------|
| Control | 9        | 10     | 1.5      | 5.5       | 10       | 2.5      | 1.2     | 0.15   | 0.015 | 0.05      |
| 1       | 9        | 10     | 1.5      | 5.5       | 10       | 2.5      | 1.2     | 0.15   | 0.015 | 0.05      |
| 2       | 9        | 10     | 1.5      | 5.5       | 10       | 2.5      | 0.5     | 0.015  | 0*    | 0*        |
| 3       | 9        | 10     | 1.5      | 5.5       | 10       | 2.5      | 1.0     | 0.015  | 0*    | 0*        |
| 4       | 9        | 10     | 1.5      | 5.5       | 10       | 2.5      | 1.2     | 0.015  | 0*    | 0*        |
| 5       | 9        | 10     | 1.5      | 5.5       | 10       | 2.5      | 1.2     | 0.015  | 0*    | 0.05      |
| 6       | 9        | 10     | 1.5      | 5.5       | 10       | 2.5      | 1.2     | 0.15   | 0*    | 0*        |
| 7       | 9        | 10     | 1.5      | 5.5       | 10       | 2.5      | 1.2     | 0.015  | 0.015 | 0*        |
| 8       | 9        | 5      | 1.5      | 5.5       | 10       | 2.5      | 0*      | 0.015  | 0*    | 0*        |
| 9       | 9        | 0*     | 1.5      | 5.5       | 10       | 2.5      | 0*      | 0.015  | 0*    | 0*        |
| 10      | 9        | 10     | 1.5      | 5.5       | 10       | 2.5      | 0*      | 0.015  | 0*    | 0*        |

*It should be noted that it is not possible to remove all trace of these elements; therefore although not intentionally present traces of these elements will be left in the alloy.

It will be seen that alloy 1 is identical to the control alloy; any difference in properties is therefore due to the structural difference between a single-crystal casting (alloy 1) and a directionally solidified casting (control). The remaining alloys each demonstrate the effect of a change in the constitution of the material. It will be seen that alloys 2-5, 8 and 10 fall within the range of the present invention, while 1, 6, 7, and 9 are outside the invention.

In all cases illustrated in FIGS. 1 and 2 the alloys were solution heat treated at a temperature of 870° C. for 16 hours.

Referring to the diagrams, FIG. 1 illustrates the life of samples of the various alloys when maintained under a stress of 730 MPa at a temperature of 760° C. This is a standard test procedure to determine the stress-rupture properties of the alloy and will not be further elaborated upon in this specification. It will be seen that the control alloy has a life of less than 80 hours, while the same alloy in single crystal form (alloy 1) has almost double this life at 145 hours. The first alloy in accordance with the invention (alloy 2) has a life of almost 260 hours, a dramatic improvement. Alloys 3, 4 and 5 although not reaching this peak also demonstrate a marked improvement with lives of over 200, over 200 and over 230 hours respectively.

Alloys 6 and 7 fall outside the invention by virtue of high carbon level for alloy 6 and in the case of alloy 7, high Boron level. Neither of these alloys is as good as Alloy 1, and in the case of alloy 7 the life is almost as low as in the case of the control. Alloys 8 and 10 again return to the levels shown in the case of alloys 3 and 4 (over 200 hours) while alloy 9, not according to the invention because of its very low Cobalt level, is again no better than the control. It is interesting to note that this alloy is in fact found to be unstable after soaking for 500 hours at elevated temperatures in the range 850°–1050° C.

Turning now to FIG. 2, this shows the results obtained by a similar test procedure to that referred to above but at a higher temperature (1040° C.) and correspondingly lower stress (128 MPa). It will be seen that the lower temperature behaviour is largely repeated. Thus the single crystal alloy 1 is similar to the control, and alloys 2–5 show a considerable improvement over these two. Alloy 6 is much less effective, alloy 9 not according to the invention is somewhat better while alloy 8 shows considerable promise at this condition and in fact comprises the best all-round balance of properties especially when heat treated (see below). Alloy 7 is similar to Alloy 5 in this hot condition, but of course its very poor lower temperature result tells against it.

It will be seen therefore that the alloys according to the present invention show a marked improvement in their properties out of all proportion to the relatively small change in constituents. Although the stress-rupture life is very important to the utility of an alloy, it is not the sole parameter to be considered, however, the changes made in accordance with the invention are unlikely to deleteriously affect any significant alloy parameters and are found to improve certain of them.

Thus the incipient melting point is increased by the lower levels of Boron and Zirconium which are melting point depressants. This is advantageous both because it gives a straightforward opportunity to raise the operating temperature of the alloy and because it allows a higher temperature solution heat treatment to be used. By raising the temperature of the heat treatment the degree to which the γ' strengthening phase is taken into solution is increased, and the stress-rupture life is increased even more.

The following table demonstrates the increase in incipient melting point and the stress-rupture results obtained using the higher temperature heat treatment then available. It will be seen that the stress-rupture life is again quoted at the conditions used to obtain the results shown in FIGS. 1 and 2, the results are therefore comparable. The modified heat treatment includes cooling from the solution treatment temperature to room temperature and a subsequent ageing heat treatment at a lower temperature. Clearly the heat treatment temperature must be less than the melting point, which for some alloys of the invention could be less than the preferred 1260°–1320° C.

| Material | Incipient Melting Point | Heat treatment | Life at stress 730 MPa temperature 760° C. | Life at stress 128 MPa temperature 1040° C. |
|---|---|---|---|---|
| Alloy 1 | 1180° C. | 16 hrs at 870° C. | 145 hrs | 104 hrs |
| Alloy 9 | 1320° C. | 16 hrs at 870° C. | 75 hrs | 109 hrs |
|  |  | 1 hr at 1320° C. + 16 hrs at 870° C. | 187 hrs | 294 hrs |
| Alloy 8 | 1320° C. | 16 hrs at 870° C. | 216 hrs | 203 hrs |
|  |  | 1 hr at 1320° C. + 16 hrs at 870° C. | 435 hrs | 325 hrs |
| Alloy 10 | 1300° C. | 16 hrs at 870° C. | 210 hrs | 177 hrs |
|  |  | 1 hr at 1300° C. + 16 hrs at 870° C. | 335 hrs | 291 hrs |

It should be noted that between the initial high temperature solution treatment and the later lower temperature ageing treatment the test piece was cooled to room temperature. We find that this cooling step and the rate at which it is carried out can provide significant differences in the final properties. Thus a cooling rate of 70°–200° C. per minute for this step can lead to a marked improvement in properties.

It is clear from the above table that a considerable increase in stress-rupture life can be achieved by the use of a high temperature solution heat treatment. This is especially true of Alloy 8 which is a preferred alloy, and Alloy 9 shows up much better in this test.

Other parameters are also improved. Thus we find that by using Tantalum to replace some of the Tungsten and Molybdenum solid solution strengtheners, an improved resistance to corrosion and oxidation may be achieved. We have demonstrated the importance of this Tantalum addition by comparative tests of alloys with and without Tantalum. Thus for alloy 10 its stress rupture life at a stress of 730 MPa and temperature of 760° was 210 hours, while its life at 128 MPa and 1040° C. was 177 hours (see table). Test pieces were prepared of an alloy nominally identical but without Tantalum, and the corresponding lives were 67 and 51 hours. The Tantalum is clearly necessary at the amounts tested, and in fact we believe that additions up to and perhaps just above 3% may be beneficial. Further testing of the oxidation resistance of the alloy confirmed the importance of the Tantalum addition. Thus three samples, one of the control alloy, one of Alloy 8 but without Tantalum and one of Alloy 8 with Tantalum replaced by Tungsten were subject to 90 hours at 1050° C. in an atmosphere of air plus 4 parts per million of salt. After this time the control alloy showed 140μ attack, while both the other samples had a more severe attack of of 200μ. Also the low levels of Carbon give rise to relatively small carbide particles, and thus avoid the large, scriptic morphology carbides which can reduce the oxidation performance of aluminide coated (also true of D.S.) nickel-based superalloys. As an example, we carried out corrosion tests on an aluminide coated isotropic material otherwise similar to the control material referred to above, and found that with fine carbides the life was more than doubled compared with the normal state.

We also find that the impact strength of the materials in accordance with the invention is considerably improved when compared with that of the unmodified directionally solidified material. We believe that this effect is due to the absence of the scriptic carbides.

The stability of the alloy, which is determined by the Aluminium, Titanium, Chromium, Tungsten and Cobalt levels is not affected to any serious degree, by the modifications specified, however, it will be appreciated that by taking alloys whose constituents are at the extremes of the claimed ranges it may be possible to produce alloys of reduced stability, which may of course still be useful alloys.

As mentioned above, there is a significant difference between the nominal amounts of Titanium in Alloys 8 and 9 which provided good properties after the high temperature heat treatment, and the actual amounts. Subsequent testing revealed that there is a marked transition at a Titanium content of about 1.7%, alloys with 1.7% Titanium or more offering exceedingly good properties after high temperature solution treatment. Below this level the properties may still offer a useful increment over those of the control alloys, but we believe that the fullest advantage of the invention is given by keeping the proportion of Titanium or its equivalent at greater than 1.7%.

We believe that Niobium may be used or a substitute for Titanium in an equiatomic amount; this involving substituting the Niobium for the Titanium in a ratio of approximately 2 to 1, and hence lead to the requirement that the sum of the amount of Titanium plus half that of Niobium should lie within a predetermined range.

This thinking is reflected in the composition of the first three alloys, referred to as alloys 11-13 inclusive, of the following table, in which proportions of constituents are set out in weight percent. Alloy 11 represents an optimum composition, which Alloys 12 and 13 are versions in which the Titanium content is replaced partially and fully by Niobium. This substitution gives a potential hardening of the γ' phase of the material.

A similar effect is achieved in Alloys 14 and 15 by substituting Titanium for Tantalum. The γ' phase is hardened in Alloys 16 and 17 by the substitution of Vanadium for Tungsten, which provides a stronger alloy but of somewhat reduced oxidation resistance. The same effect is achieved in Alloys 18 and 19 by substituting Molybdenum for Tungsten. In Alloy 20, the balance of the alloy is altered by the substitution of Aluminium plus Titanium for Tungsten, softening the γ' phase but providing an improvement in the properties of the alloy.

Finally, alloys 21, 22 and 23 alter the alloy balance by variation in the Cobalt level.

It will be noted that none of the alloys have any deliberate addition of Boron or Zirconium.

| Alloy | Chromium | Cobalt | Titanium | Aluminium | Tungsten | Tantalum | Molybdenum | Niobium | Vanadium | Carbon |
|---|---|---|---|---|---|---|---|---|---|---|
| 11 | 8.5 | 5 | 2.2 | 5.5 | 9.5 | 2.8 | — | — | — | 0.015 |
| 12 | 8.5 | 5 | 1.1 | 5.5 | 9.5 | 2.8 | — | 2.1 | — | 0.015 |
| 13 | 8.5 | 5 | — | 5.5 | 9.5 | 2.8 | — | 4.3 | — | 0.015 |
| 14 | 8.5 | 5 | 2.6 | 5.5 | 9.5 | 1.4 | — | — | — | 0.015 |
| 15 | 8.5 | 5 | 2.9 | 5.5 | 9.5 | — | — | — | — | 0.015 |
| 16 | 8.5 | 5 | 2.2 | 5.5 | 7.75 | 2.8 | — | — | 0.5 | 0.015 |
| 17 | 8.5 | 5 | 2.2 | 5.5 | 6.5 | 2.8 | — | — | 1.0 | 0.015 |
| 18 | 8.5 | 5 | 2.2 | 5.5 | 6.6 | 2.8 | 1.5 | — | — | 0.015 |
| 19 | 8.5 | 5 | 2.2 | 5.5 | 3.8 | 2.8 | 3.0 | — | — | 0.015 |
| 20 | 8.5 | 5 | 2.5 | 6.25 | 3.2 | 2.8 | — | — | — | 0.015 |
| 21 | 8.5 | — | 2.2 | 5.5 | 9.5 | 2.8 | — | — | — | 0.015 |
| 22 | 8.5 | 10 | 2.2 | 5.5 | 9.5 | 2.8 | — | — | — | 0.015 |
| 23 | 8.5 | 15 | 2.2 | 5.5 | 9.5 | 2.8 | — | — | — | 0.015 |

We claim:

1. A single crystal casting cast from an alloy consisting essentially of by weight percent:
   8-10% Chromium,
   3-7% Cobalt,
   1.7-2.6% Titanium,
   5.25-5.75% Aluminium,
   9-11% Tungsten,
   2.25-3.2% Tantalum,
   0-0.5% Hafnium,
   0.015-0.05% Carbon,
   0-0.01% Boron,
   0.0-0.05% Zirconium,
   balance essentially Nickel plus incidental impurities.

2. The single crystal casting as claimed in claim 1 in which the alloy consists essentially of by weight percent,
   9% Chromium,
   5% Cobalt,
   1.7% Titanium,
   5.5% Aluminium,
   10% Tungsten,
   2.5% Tantalum,
   0.015% Carbon,
   balance essentially Nickel plus incidental impurities.

3. The single crystal casting as claimed in claim 1 in which the alloy consists essentially of by weight percent,
   8.5% Chromium,
   5% Cobalt,
   1.7% Titanium,
   5.5% Aluminium,
   9.5% Tungsten,
   3.2% Tantalum,
   0.02% Carbon,
   balance essentially Nickel plus incidental impurities.

4. The single crystal casting as claimed in claim 1 in which the alloy consists essentially of by weight percent,
   8.5% Chromium,
   5% Cobalt, 2.2% Titanium, 5.5% Aluminium, 9.5% Tungsten, 2.8% Tantalum, 0.015% Carbon, balance essentially Nickel plus incidental impurities.

5. A solution heat treatment for the single crystal casting of claim 1, 2, 3 or 4 comprising heating the casting to a temperature in the range 1300°–1320° C.

6. A solution heat treatment as claimed in claim 5 and comprising cooling the casting from said temperature to room temperature at a rate of 70° to 200° C. per minute.

7. A solution heat treatment as claimed in claim 6 and in which the casting is subsequently heated to a temperature of about 870° C.

8. A solution heat treatment as claimed in claim 7 and comprising heating the casting to a temperature of about 1320° C. for 4 hours, cooling the casting to room temperature and heating it to a temperature of about 870° C. and maintaining it as this temperature for 16 hours.

* * * * *